United States Patent
Nagase et al.

(10) Patent No.: US 7,451,048 B2
(45) Date of Patent: Nov. 11, 2008

(54) METHOD AND APPARATUS FOR ANALYZING ELECTROMAGNETIC WAVE, AND COMPUTER PRODUCT

(75) Inventors: Kenji Nagase, Kawasaki (JP); Sekiji Nishino, Kawasaki (JP); Takashi Yamagajou, Kawasaki (JP); Takefumi Namiki, Kawasaki (JP); Tetsuyuki Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 343 days.

(21) Appl. No.: 11/042,092

(22) Filed: Jan. 26, 2005

(65) Prior Publication Data
US 2006/0095246 A1 May 4, 2006

(30) Foreign Application Priority Data
Oct. 29, 2004 (JP) .............................. 2004-316632

(51) Int. Cl.
*G06F 3/01* (2006.01)
(52) U.S. Cl. .............................. 702/66; 702/65; 702/67; 702/70
(58) Field of Classification Search ................... 702/57, 702/65–71, 182, 189, 190; 343/767; 378/62, 378/87; 703/4, 13
See application file for complete search history.

(56) References Cited

U.S. PATENT DOCUMENTS

| | | | | |
|---|---|---|---|---|
| 6,005,916 A | * | 12/1999 | Johnson et al. | 378/87 |
| 6,067,340 A | * | 5/2000 | Eppstein et al. | 378/4 |
| 6,662,125 B2 | * | 12/2003 | Namiki | 702/66 |
| 7,124,069 B2 | * | 10/2006 | Meuris et al. | 703/13 |

FOREIGN PATENT DOCUMENTS

JP    2000-346891    12/2000

OTHER PUBLICATIONS

Oliver Podebrad et al, "New Flexible Subgridding Scheme for the Finite Integration Technique", *IEEE Transactions on Magnetics*, vol. 39, No. 3, May 2003, pp. 1662-1665.

* cited by examiner

*Primary Examiner*—Eliseo Ramos-Feliciano
*Assistant Examiner*—Felix Suarez
(74) *Attorney, Agent, or Firm*—Staas & Halsey LLP

(57) ABSTRACT

A merging unit merges partial models into an entire model, and divides a grid of a parent hierarchy into grids of a child hierarchy based on hierarchical relationship of partial models, and an object selecting unit divides a grid of an object inclusion domain that includes an object selected from the entire model by a user to create a sub grid domain, and a domain selecting unit divides a grid of a domain selected from the entire model by the user to create the sub grid domain.

6 Claims, 15 Drawing Sheets

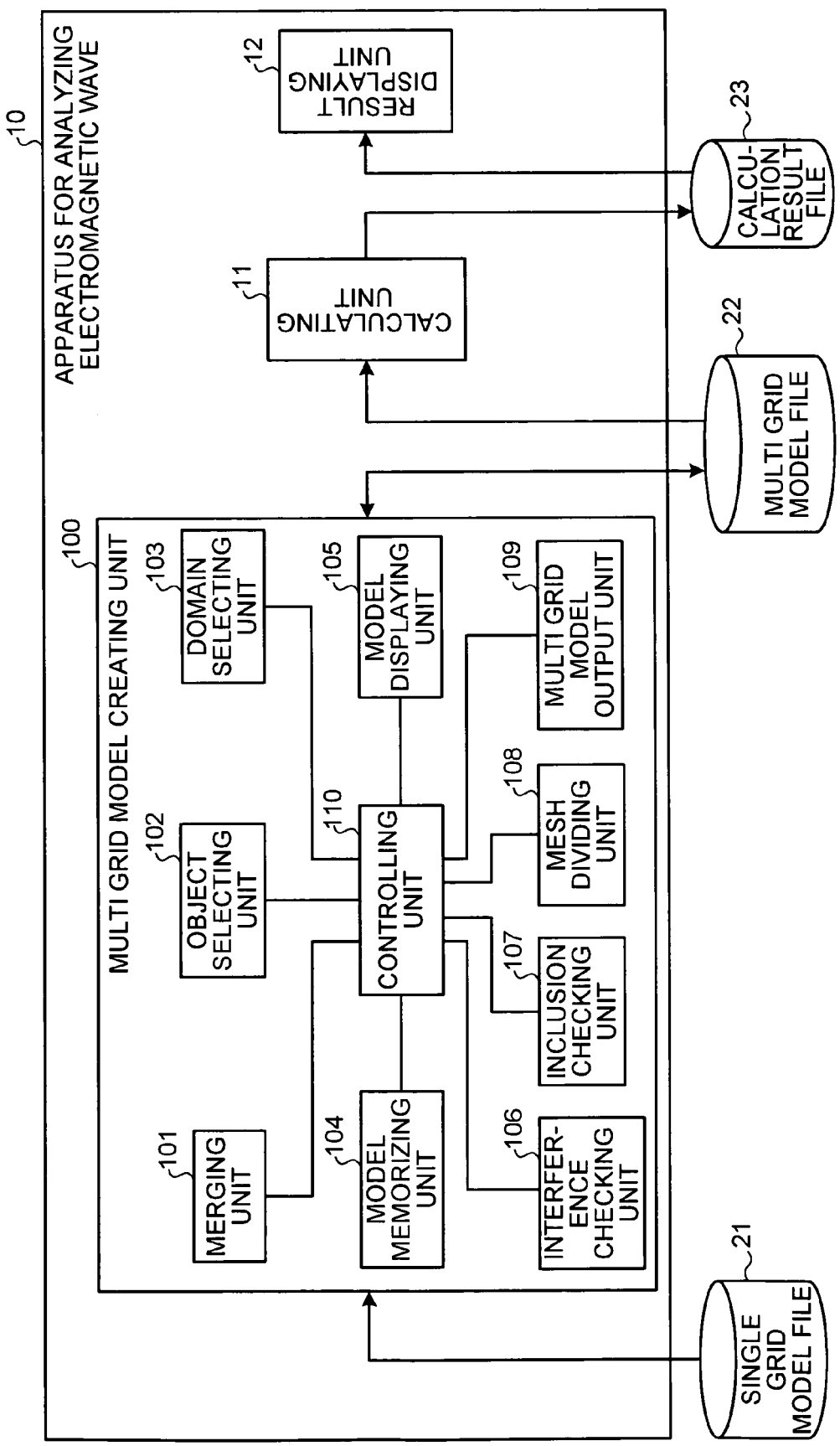

FIG.2

USER SELECTS APPEND IN TEST TO CREATE CHILD HIERARCHY IN TEST (FILE).

SCREEN A
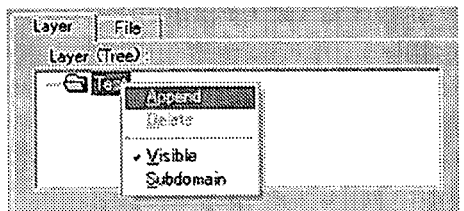

USER ALLOCATES TEST1 (FILE) TO CHILD HIERARCHY CREATED BY APPEND.

SCREEN B
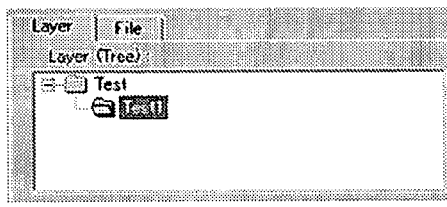

USER SELECTS APPEND IN TEST1 TO CREATE CHILD HIERARCHY IN TEST1.

SCREEN C
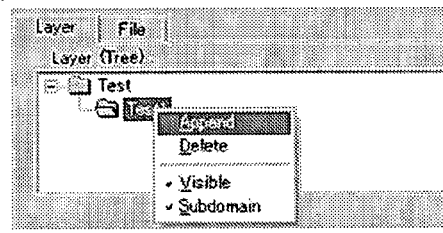

USER ALLOCATES TEST2 (FILE) TO CHILD HIERARCHY CREATED BY APPEND.

SCREEN D
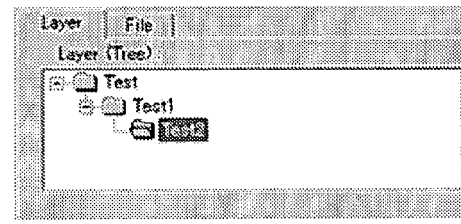

USER SELECTS APPEND IN TEST TO CREATE ANOTHER CHILD HIERARCHY IN TEST (FILE).

SCREEN E
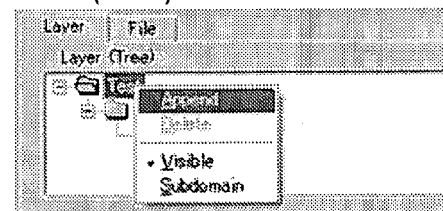

USER ALLOCATES TEST3 (FILE) TO CHILD HIERARCHY CREATED BY APPEND.

SCREEN F
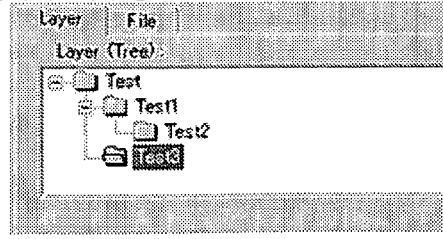

FIG.5
SCREEN A
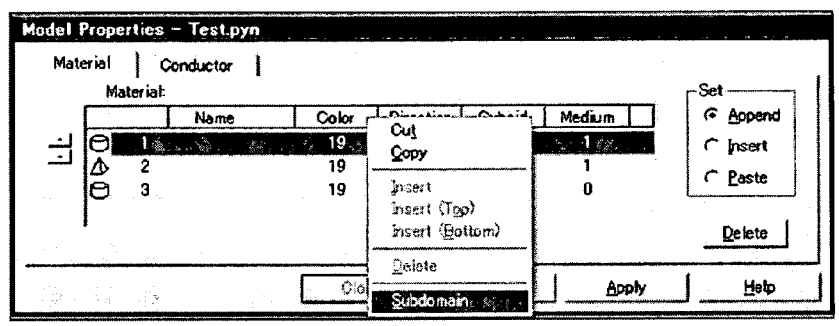
SCREEN B
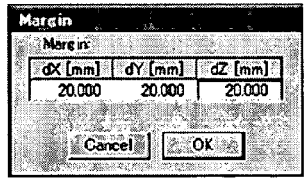
SCREEN C
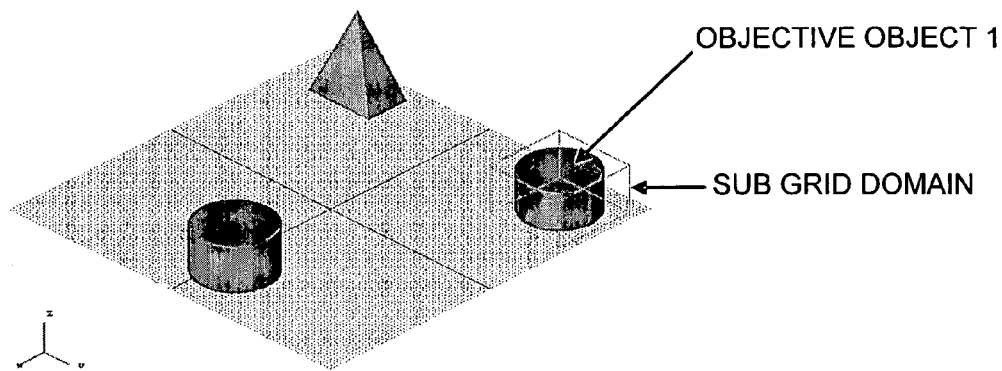

FIG.6
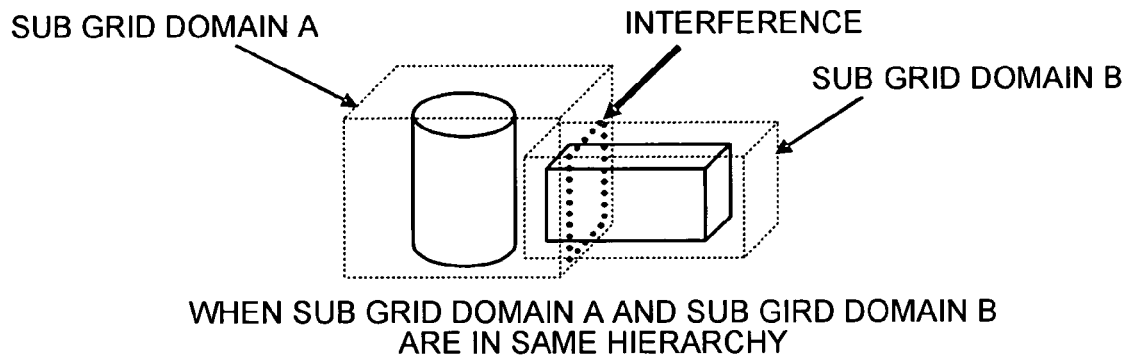
FIG.7
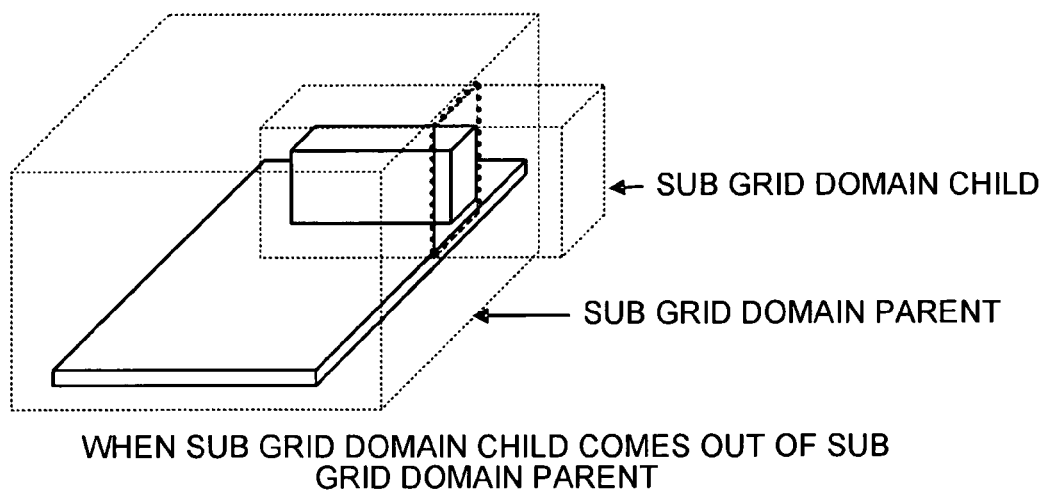
SUB GRID DOMAIN A  INTERFERENCE
SUB GRID DOMAIN B
WHEN SUB GRID DOMAIN A AND SUB GIRD DOMAIN B
ARE IN SAME HIERARCHY
FIG.8
← SUB GRID DOMAIN CHILD
← SUB GRID DOMAIN PARENT
WHEN SUB GRID DOMAIN CHILD COMES OUT OF SUB
GRID DOMAIN PARENT

FIG.9

DIVISION MAY BE MADE CONSISTENTLY WHEN CARRIED OUT FROM PARENT HIERARCHY.

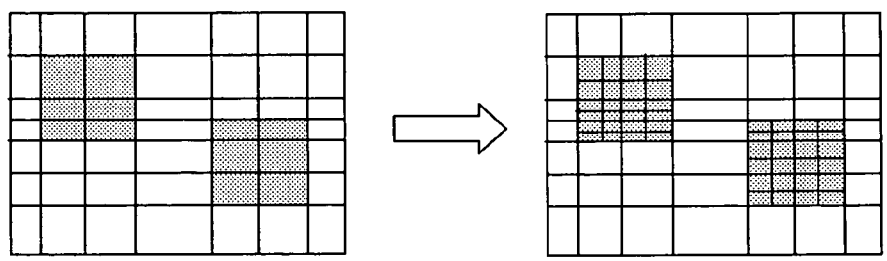

INCONSISTENT LINES OCCUR WHEN CARRIED OUT FROM CHILD HIERARCHY.
(IN CASE IN CONSIDERATION OF MESH DIVISION OF PARENT HIERARCHY, WHEN DIVISION IS TRIED TO TWICE OF MESHES OF LEFT CHILD HIERARCHY DOMAIN, MESHES OF RIGHT CHILD HIERARCHY DOMAIN DO NOT BECOME REFINEMENT FACTOR 2.)

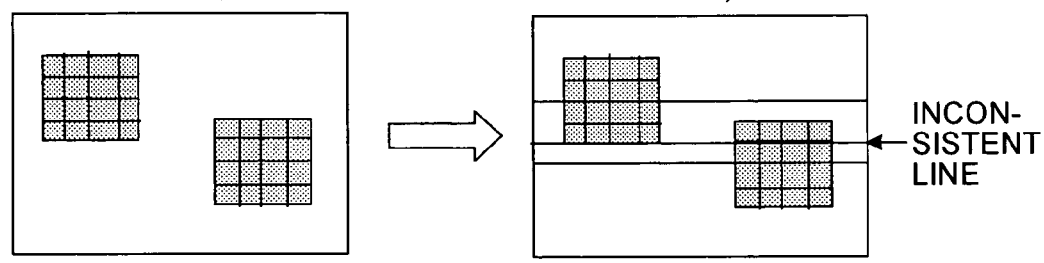

INCONSISTENT LINE

FIG.10

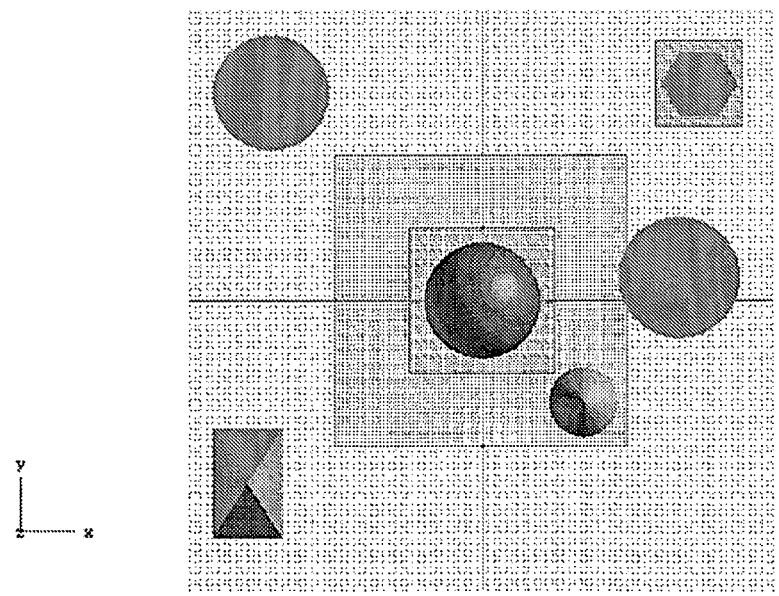

\*\*\* 1 : GRID NUMBERS \*\*\* DESIGNATE A MESH SIZE x , y , z
    81    161    121
\*\*\* 2 : OUTER SURFACE BOUNDARY \*\*\* BOUNDARY
    1    1    1    1    1    1
    8    8    8    8    8    8
    .
    .
    .

\*\*\* 22 : CELL SIZE \*\*\* DESCRIBE RESPECTIVE MESH INTERVALS IN ORDER OF X AXIS, Y AXIS, AND Z AXIS
   1.25000e-004  1.25000e-004  1.25000e-004  1.25000e-004  1.25000e-004
   1.25000e-004  1.25000e-004  1.25000e-004  1.25000e-004  1.25000e-004
   1.25000e-004  1.25000e-004  1.25000e-004  1.25000e-004  1.25000e-004
   1.25000e-004  1.25000e-004  1.25000e-004  1.25000e-004  1.25000e-004
   1.25000e-004  1.25000e-004  1.25000e-004  1.25000e-004  1.25000e-004
   . . . . . . . . . . . . . . . . . . . . . . . . . . . . .

\*\*\* 24 : MATERIAL \*\*\* PHYSICAL PROPERTY VALUES
    1    1    21    81    161    41
   1.00000e+000  1.00000e+000  0.00000e+000  0.00000e+000
   0.00000e+000

FIG.13

\*\*\* Multigrid-FDTD \*\*\*
\*\*\* Total number of embedded grids
    1
((( embedded grid record ID 1 )))
\*\*\* grid ID
    1
\*\*\* subgrid factor ⟵ SUB GRID FACTOR (REFINEMENT FACTOR): NUMBER
    2         OF FINE GRIDS TO ONE COARSE GRID
\*\*\* parent-grid recod ID
    0
\*\*\* parent-grid location indexes (is,js,ks, ie,je,ke)
   29    19    4    32    22    7
\*\*\* number of child grids
    0         REGULATE SUB GRID DOMAIN
\*\*\* child-grid IDs     WHEN DIVIDING INTO X AXIS, Y AXIS, AND Z
                      AXIS RESPECTIVELY, AND NUMBERING 1, 2, 3⋯,
                      CUTS OF MESH FROM SMALL COORDINATES,
                      DESIGNATE LARGEST ADDRESS FROM
                      SMALLEST ADDRESS OF SUB GRID DOMAIN.
                      IN CASE OF EXAMPLE, DOMAIN WHERE X, Y, Z
                      ARE FROM 29, 19, 4 TO 32, 22, 7 BECOMES SUB
                      GRID DOMAIN.

FIG.19
UNIFORM GRID 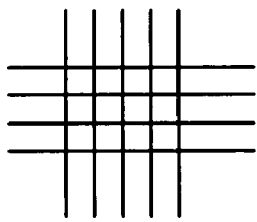
NON-UNIFORM GRID 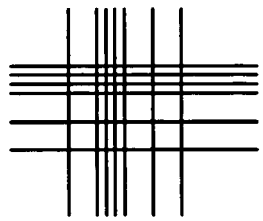
MULTI GRID 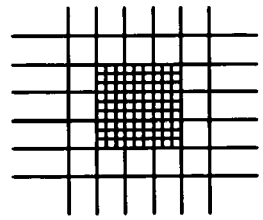

METHOD AND APPARATUS FOR ANALYZING ELECTROMAGNETIC WAVE, AND COMPUTER PRODUCT

BACKGROUND OF THE INVENTION

1) Field of the Invention

The present invention relates to a technology for analyzing an electromagnetic wave that is generated by an electronic device.

2) Description of the Related Art

Electronic devices that include high frequency circuits often produce electromagnetic waves. These electromagnetic waves are hazardous affect operation of the surrounding electronic devices. Finite Difference Time Domain (FDTD) method or the like is used to analyze the electromagnetic waves produced by the electronic devices. Herein, the FDTD method is one of electromagnetic wave analysis techniques of time domain where Maxwell's equation is made into a difference equation on time axis, and to satisfy this difference equation, electrolysis and magnetic field dispersed on a 3-dimensional grid are sequentially calculated in a spatial domain, and in an electromagnetic wave analysis by the FDTD method, as a technique for a high speed and high precision analysis, there is a multi grid method that is disclosed in, for example, Oliver Podebrad, Markus Clemens, and Thomas Weiland, "New Flexible Subgridding Scheme for the Finite Integration Technique" IEEE TRANSACTIONS ON MAGNETICS, VOL. 39, No. 3, PP 1662 to 1665, May 2003.

FIG. 19 is a figure of a mesh division (grid division) method by the FDTD method. As shown in the figure, in the FDTD method, mesh division may be made by uniform grids where intervals of grids are uniform, non-uniform grids where intervals of grids are non-uniform, and multi grids where grids are subdivided. In comparison with the multi grids where grids are subdivided, the uniform grids and the non-uniform grids are herein referred to as single grids.

In multi grid method, important portions are subdivided and calculations are made sequentially, thereby a high precision analysis becomes available on important portions, while in other portions, the grid intervals thereof are made large and calculations are made sequentially, thereby a high speed analysis becomes available.

However, to carry out an electromagnetic wave analysis by the FDTD method by use of multi grids, it is necessary to create a multi grid model, but it is difficult to create a multi grid model, which has been a problem in the conventional art.

In concrete, it is necessary to prepare a control file where information concerning multi grids is defined, and it is required for experts to manually create this control file, and it is difficult to create this control file, which has been another problem in the conventional art.

SUMMARY OF THE INVENTION

It is an object of the present invention to solve at least the above problems in the conventional technology.

An apparatus according to one aspect of the present invention analyzes electromagnetic waves generated by an electronic device, and includes a multi grid model creating unit that creates a multi grid model from a single grid model; and an analyzing unit that analyzes the electromagnetic wave using the multi grid model created.

A method for analyzing electromagnetic waves generated by an electronic device according to another aspect of the present invention includes creating a multi grid model from a single grid model; and analyzing the electromagnetic waves using the multi grid model created.

A computer-readable recording medium according to still another aspect of the present invention stores a computer program for realizing a method according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a block diagram of an apparatus for analyzing an electromagnetic wave according to an embodiment of the present invention;

FIG. 2 is a schematic of an example of a merge operation screen that is displayed by a merging unit;

FIG. 5 is a schematic of an example of an object selection screen that is displayed by an object selecting unit;

FIG. 6 is a schematic of an example of a coordinate correction screen that is displayed by a domain selecting unit displays;

FIG. 7 is a schematic of an interference check function of an interference checking unit;

FIG. 8 is a schematic of an inclusion check function of an inclusion checking unit;

FIG. 9 is schematic for explaining a mesh division;

FIG. 10 is a schematic of an example of a projected image of objects by a mesh dividing unit;

FIG. 13 is a schematic of a format of a control file;

FIG. 19 is a schematic for explaining a mesh division method by an FDTD method.

DETAILED DESCRIPTION

Figure 3:
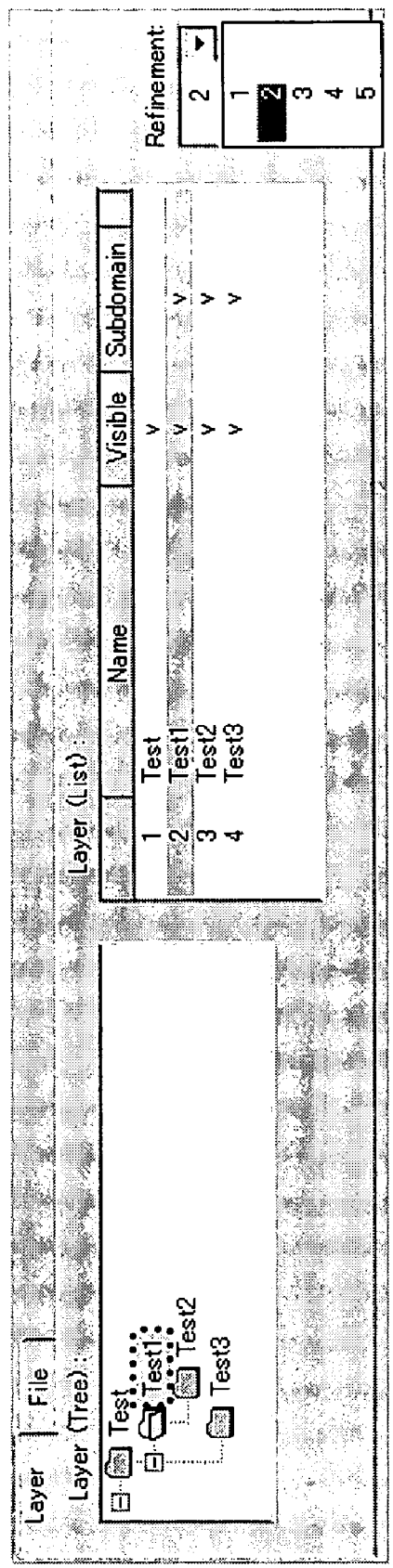
FIG. 3 is a schematic of an example of a refinement factor selection screen that is displayed by the merging unit.

Exemplary embodiments of a method and an apparatus for analyzing an electromagnetic wave, and a computer product according to the present invention are explained in detail below with reference to the accompanying drawings.

FIG. 1 is a block diagram of an apparatus for analyzing an electromagnetic wave according to an embodiment of the present invention. As shown in FIG. 1, an apparatus for analyzing an electromagnetic wave 10 includes a multi grid model creating unit 100, a calculating unit 11, and a result displaying unit 12.

The multi grid model creating unit 100 is a processing unit that inputs a single grid model from a single grid model file 21 and creates a multi grid model, and outputs the created multi grid model to a multi grid model file 22.

This multi grid model creating unit 100 may repeat a process to read the multi grid model file 22 and thereby add and modify multi grid models, and output them to the multi grid model file 22.

Further, the single grid model file 21 is a file to be created by this apparatus for analyzing an electromagnetic wave 10, and there are a case where it consists of plural files storing partial models, and another case where it consists of a file storing an entire model.

When the single grid model file 21 consists of plural files, a parent hierarchy file that defines an entire model space (rectangular solid domain), and a child hierarchy file that defines partial models, and to the respective files, an object that configures a model and a rectangular solid domain including the object are defined.

The calculating unit 11 is a processing unit that reads a multi grid model from the multi grid model file 22 and carries out an electromagnetic wave analysis, and stores the analysis result to a calculation result file 23, meanwhile, the result displaying unit 12 is a processing unit that displays the analysis result stored in the calculation result file 23 to a display device.

The multi grid model creating unit 100 includes a merging unit 101, an object selecting unit 102, a domain selecting unit 103, a model memorizing unit 104, a model displaying unit 105, an interference checking unit 106, an inclusion checking unit 107, a mesh dividing unit 108, a multi grid model output unit 109, and a controlling unit 110.

The merging unit 101 is a processing unit that, when the signal grid model file 21 consists of a parent hierarchy file and a child hierarchy file, merges partial models stored in the child hierarchy file hierarchically into a model space defined by the parent hierarchy, and makes grids in the domain of the child hierarchy whose hierarchy is in a parent/child relation into subdivided grids of the parent hierarchy, and thereby creates a multi grid model.

In concrete, this merging unit 101 displays a merge operation screen, and merges files that a user hierarchically designates on the merge operation screen. FIG. 2 is a schematic of an example of a merge operation screen that is displayed by the merging unit 101.

The screen A indicates a case where the user selects Append to a file "Test" to create a child hierarchy in the "Test", and the screen B indicates a case where the user allocates a child hierarchy file "Test1" to the child hierarchy in the file "Test". Herein, the "Test" is a parent hierarchy file that defines a rectangular solid space of an entire model.

In the same manner, the screen C indicates a case where the user selects Append to a child hierarchy file "Test1" to create a child hierarchy in the child hierarchy file "Test1" and merge the child hierarchy file, and the screen D indicates a case where the user allocates a child hierarchy file "Test2" to the child hierarchy in the file "Test1".

Further, the screen E indicates a case where the user selects Append to the file "Test" to merge another child hierarchy file to the child hierarchy of the parent hierarchy file "Test", and the screen F indicates a case where the user allocates a child hierarchy file "Test3" to the child hierarchy in the file "Test".

In this manner, the merging unit 101 merges files that the user hierarchically designates on the merge operation screen, and memorizes the hierarchy relation among the files as a hierarchy relation of refinement of grids among the rectangular solid domains defined in the files into the model memorizing unit 104, thereby creates a multi grid model.

Further, this merging unit 101 lets the user select the number with which one grid of a parent is divided by a child, to files in a parent/child relation, and memorizes the selected number as a refinement factor into the model memorizing unit 104.

FIG. 3 is a schematic of an example of the refinement factor selection screen that is displayed by the merging unit 101. As shown in FIG. 3, the merging unit 101 lets the user designate a parent file and the number of grid subdivisions, thereby acquires a refinement factor, and memorizes it into the model memorizing unit 104.

The user designates "2" as the refinement factor to "Test1". Therefore, the rectangular solid domain of the "Test2" as a child of the "Test1" becomes a sub grid domain where respective grids defined in the "Test1" are divided into two.

Figure 4:
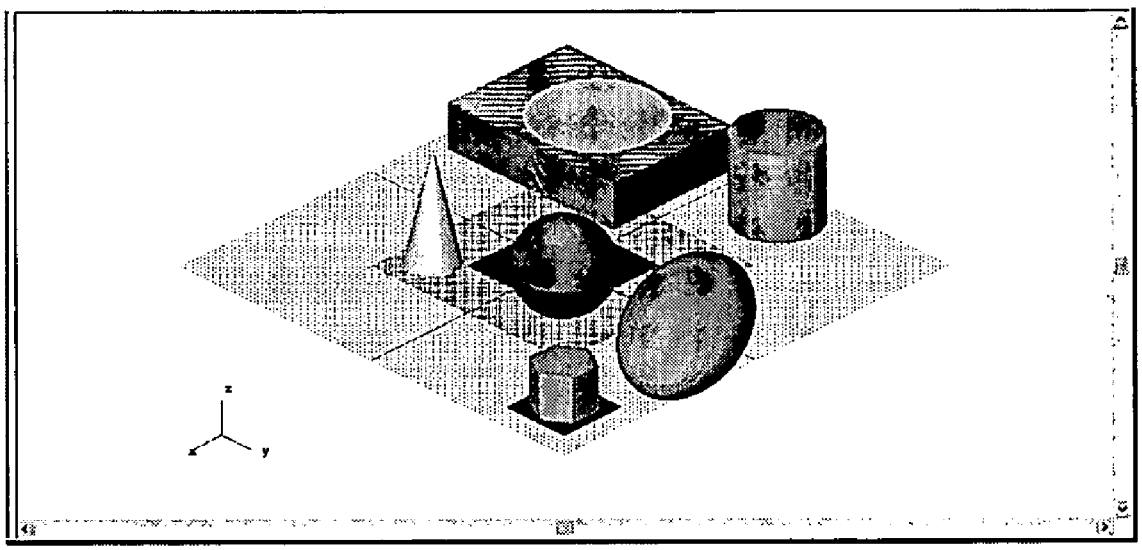
FIG. 4 is a schematic of a display example of a multi grid model that is displayed by the merging unit.

Further, this merging unit 101 not only displays the merge operation screen shown in FIG. 2 via the model displaying unit 105, but also displays a created multi grid model. FIG. 4 is a schematic of a display example of a multi grid model that is displayed by the merging unit 101. As shown in FIG. 4, in this display example, in addition to objects such as a sphere, a circular cone and the likes, grids of three levels are displayed. The grid in the grid domain that appears thinnest is most rough, meanwhile, the grid of the sub grid domain whose grid domain appears thicker is finer.

Further, the merging unit 101 checks interference among partial models in a same hierarchy using the interference checking unit 106, and checks inclusion among partial models of a parent hierarchy by use of the inclusion checking unit 107.

Referring back to FIG. 1, the object selecting unit 102 is a processing unit that, when the single grid model file 21 is a file storing an entire model, makes an object inclusion domain as the rectangular solid domain including the object selected by the user from the model a child hierarchy domain, i.e., a sub grid domain, and divides grids in the sub grid domain by use of the refinement factor designated by the user and thereby creates a multi grid model.

FIG. 5 is a schematic of an example of the object selection screen that is displayed by the object selecting unit 102. As shown in FIG. 5, this object selecting unit 102 displays a list of objects configuring a model, and lets the user select objects, thereby determines coordinates of the sub grid domain to be defined as a child hierarchy and stores them into the model memorizing unit 104.

The screen A displays a screen where the object selecting unit 102 displays the list of objects configuring a model, and the user selects "objective object 1" and designates Subdomain and thereby defines a child hierarchy, meanwhile, the screen B displays a screen where the objective selecting unit makes the user designate a margin between the minimum rectangular solid domain including the selected objects and the object inclusion domain to be defined as the child hierarchy. In this example, the user designates 20 mm as the margin.

Meanwhile, the screen C displays a screen that the object selecting unit 102 displays the object inclusion domain defined as the child hierarchy as a sub grid domain via the model displaying unit 105.

Further, the object selecting unit 102 carries out an inclusion check whether the sub grid domain defined as the child hierarchy is completely included in the rectangular solid domain of the current hierarchy by use of the inclusion checking unit 107.

The domain selecting unit 103 is a processing unit that, when the single grid model file 21 is a file storing an entire model, makes the partial domain of the rectangular solid selected by the user from the model a sub grid domain, and divides grids of the sub grid domain by use of the refinement factor designated by the user and thereby creates a multi grid model.

This domain selecting unit 103 displays the entire model, and displays coordinates of the rectangular solid domain of the child hierarchy that the user selects on the display screen by use of a mouse. Further, when the user inputs corrected coordinates of the rectangular solid on the screen, the domain selecting unit stores them as information of the rectangular solid domain of the child hierarchy into the model memorizing unit 104.

FIG. 6 is a schematic of an example of a coordinate correction screen that is displayed by the domain selecting unit 103. As shown in FIG. 6, in this coordinate correction screen, three sets of x coordinates, y coordinates and z coordinates are displayed. The first set of coordinates is the coordinates of a start point of the rectangular solid that the user has dragged by the mouse, the second set of coordinates is the coordinates of the end point of the plane that the user has dragged from the start point, and the third set of coordinates is the coordinates of the end point of the rectangular solid.

In FIG. 6, coordinates are shown in the case where first on the xy plane, a plane with (−0.94, −0.92, 0.00) as its start point and (−0.32, −0.06, 0.00) as its end point is selected by the user, then, the mouse is dragged in the z axis direction and (−0.32, −0.06, 0.20) is selected as the end point of the rectangular solid. The user, by correcting these coordinates, may change the rectangular solid domain selected by the mouse.

Further, this domain selecting unit 103, when a sub grid domain of the same hierarchy as the current hierarchy is selected, carries out an interference check among sub grid domains by use of the interference checking unit 106, meanwhile, in the case where a sub grid domain of the child hierarchy of the current hierarchy is selected, it carries out an inclusion check of the rectangular solid domain of the parent hierarchy by use of the inclusion checking unit 107.

This domain selecting unit 103, when one object exists over plural sub grids whose hierarchies are different, divides the object into parts belonging to the respective hierarchies, meanwhile, the entire object may be set to be included in the respective hierarchies. By setting the entire object to be included in the respective hierarchies, a process to divide an object by a boundary surface becomes unnecessary, and it is possible to make the entire process at a high speed.

The model memorizing unit 104 is a memorizing unit that memorizes information of a multi grid model created by the merging unit 101, the object selecting unit 102 or the domain selecting unit 103, and memorizes information concerning the model, and information concerning the hierarchy relation of grids.

The model displaying unit 105 is a processing unit that displays information concerning multi grid creation on a display device, and displays the multi grid model shown in FIG. 4 and the emerge operation screen shown in FIG. 3 and the likes.

The interference checking unit 106 is a processing unit that checks interference among sub grid domains where grids are in a same hierarchy, and in the case of interference among sub grid domains, it displays an error message.

FIG. 7 is a schematic of an interference check function by the interference checking unit 106. As shown in FIG. 7, the interference checking unit 106, when two sub grid domains are in a same hierarchy, checks whether there is interference between the sub grids. This check may be made by use of coordinates of vertexes of the two sub grid domains. In FIG. 7, a case is shown where there is interference between a sub grid domain A and a sub gird domain B in a same hierarchy.

The inclusion checking unit 107 is a processing unit that checks an inclusion relation of rectangular solid domains where grid hierarchies are in a parent/child relation, and when a child rectangular solid domain is not included completely in a parent rectangular solid domain, it displays an error message.

FIG. 8 is schematic of an inclusion check function by the inclusion checking unit 107. As shown in FIG. 8, the inclusion checking unit 107, when there is a parent/child hierarchy relation between two sub grid domains, checks whether the sub grid domain of the child hierarchy is included completely in the sub grid domain of the parent hierarchy. This check may be made by use of coordinates of vertexes of the two sub grid domains too. In FIG. 8, a case is shown where the sub grid domain child comes out of the sub grid domain parent.

The mesh dividing unit 108 is a processing unit that carries out a mesh division by use of the refinement factor, and carries out the mesh division sequentially from parent hierarchy. FIG. 9 is schematic for explaining the mesh division.

As shown in FIG. 9, in the mesh division, division may be made consistently when carried out sequentially from a parent hierarchy, however, when carried out from a child hierarchy, inconsistent lines occur where meshes of a child hierarchy domain do not become correct refinement factors. Therefore, the mesh dividing unit 108 carries out the mesh division sequentially from a parent hierarchy.

Further, to divide the shape of an object into meshes, it is necessary for a parent hierarchy to recognize the object shape. Therefore, the mesh dividing unit 108, in the mesh division, projects all the objects to a boundary, and while using the projected data in all the hierarchies, carries out the mesh division from a parent hierarchy.

FIG. 10 is a schematic of an example of a projected image of objects by the mesh dividing unit 108. As shown in FIG. 10, objects such as a sphere, a circular cone, a square cone and the likes and grid fineness degrees of respective hierarchies are projected to a boundary.

Figures 11, 12:
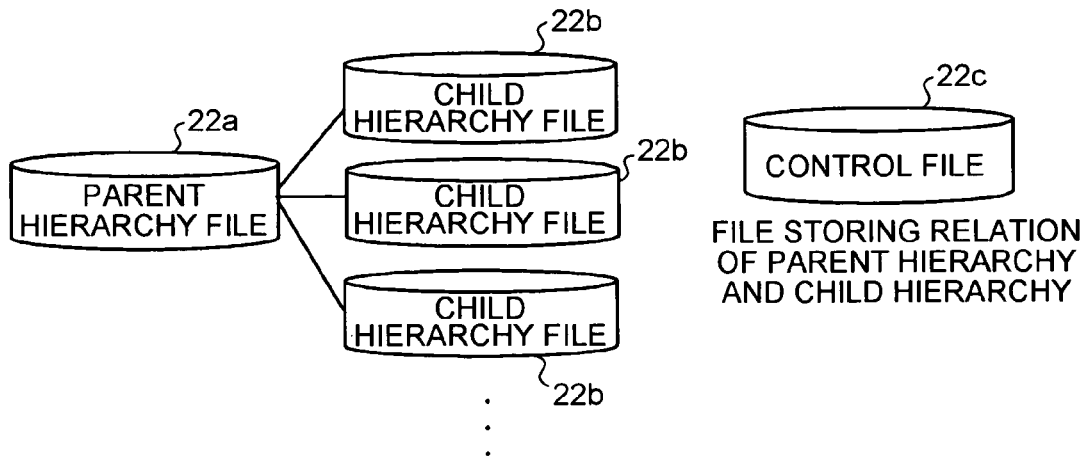
FIG. 11 is a schematic of a multi grid model file.
FIG. 12 is a schematic of a format of a parent hierarchy file and a child hierarchy file.

The multi grid model output unit 109 is a processing unit that outputs a multi grid model memorized in the model memorizing unit 104 to a multi grid model file 22. FIG. 11 is a schematic of the multi grid model file 22.

As shown in FIG. 11, the multi grid model file 22 includes a parent hierarchy file 22a and a child hierarchy file 22b that memorize a model, and a control file 22c that memorizes a hierarchy relation.

The parent hierarchy file 22a is a file that memorizes information concerning the rectangular solid domain of an entire model, and only one file exists in the multi grid model file 22. The child hierarchy file 22b is a file that memorizes information concerning partial models, and the number corresponding to the number of child hierarchies of the child hierarchy files 22b exist in the multi grid model file 22.

FIG. 12 is a schematic of a format of the parent hierarchy file 22a and the child hierarchy file 22b. In FIG. 12, "GRID NUMBERS" are the numbers of grids in x axis, y axis, and z axis, and herein, a case is shown where there are "81" grids in the x axis direction, there are "161" grids in the y axis direction, and there are "121" grids in the z axis direction.

"OUTER SURFACE BOUNDARY" is information concerning 6 planes as boundaries of the rectangular solid domain, for example, "1" indicates that the plane is completely conductive. "CELL SIZE" indicates respective mesh intervals in the order of the x axis, the y axis, and the z axis. Herein, a case is shown where the mesh intervals in the x axis direction is all "1.25e to 004".

"MATERIAL" indicates the rectangular solid partial domain designated by grid values of 2 points and the physical property values thereof, herein, it indicates the dielectric constant, the magnetic permeability and the likes of a rectangular solid partial domain with (1, 1, 21) as its start point and (81, 161, 41) as its end point.

The single grid model file 21 has the same format too. Further, when the single grid model file 21 consists of plural files, one parent hierarchy file 22a and the number corresponding to the number of partial models of the child hierarchy file 22b are included in the single grid model file 21.

FIG. 13 is a schematic of a format of the control file 22c. "Total number of embedded grids" shown in FIG. 13 is the number of the child hierarchy files 22b, and herein, a case is shown where the number of the child hierarchy files 22b is "1".

In "(((embedded grid record ID I)))" and below, information concerning the child hierarchy is defined, and "grid ID" is an identifier that identifies a child hierarchy, and herein, a case is shown where the identifier is "1".

"subgrid factor" is the number of refinement factors, i.e., the number of child grids to one parent grid, herein, a case where the refinement factor is "2" is shown.

"parent-grid record ID" is an identifier that identifies a parent hierarchy of this child hierarchy, and herein, a case is shown where the rectangular solid domain of an entire model is a parent hierarchy.

"parent-grid location indexes (is, js, ks ie, je, ke)" indicates a sub grid domain, and indicates a start point (is, js, ks) and an end point (ie, je, ke) in a parent grid. Herein, a case is shown where (29, 19, 4) is the start point, and (32, 22, 7) is the end point.

"number of child grids" indicates the number of child hierarchies included in this child hierarchy, and herein, a case where the number of child hierarchies included in this child hierarchy is "0" is shown. Further, when there is a child hierarchy, an identifier of the child hierarchy is defined after "child-grid IDs".

This control file 22c is a file that is automatically created by the multi grid model output unit 109 from information of a multi grid model stored into the model memorizing unit 104 by the merging unit 101, the object selecting unit 102 or the domain selecting unit 103, meanwhile, in the conventional art, it has been necessary to manually create this control file 22c.

In this manner, the multi grid model creating unit 100 according to the present embodiment automatically creates the control file 22c that has been manually created in the conventional art, via dialogs with a user by use of the screen shown in FIG. 2 to FIG. 4, therefore, it is possible to create a multi grid model efficiently.

The multi grid model creating unit 100 may repeat a process to input an output multi grid model file, and make modification or addition to the multi grid model, and output it to the multi grid model file.

The controlling unit 110 is a processing unit that takes an entire control over the multi grid model creating unit 100, and in concrete, it transfers controls between functional units and sends and receives data among functional units and memorizing units, thereby creates a multi grid model.

Figure 14:
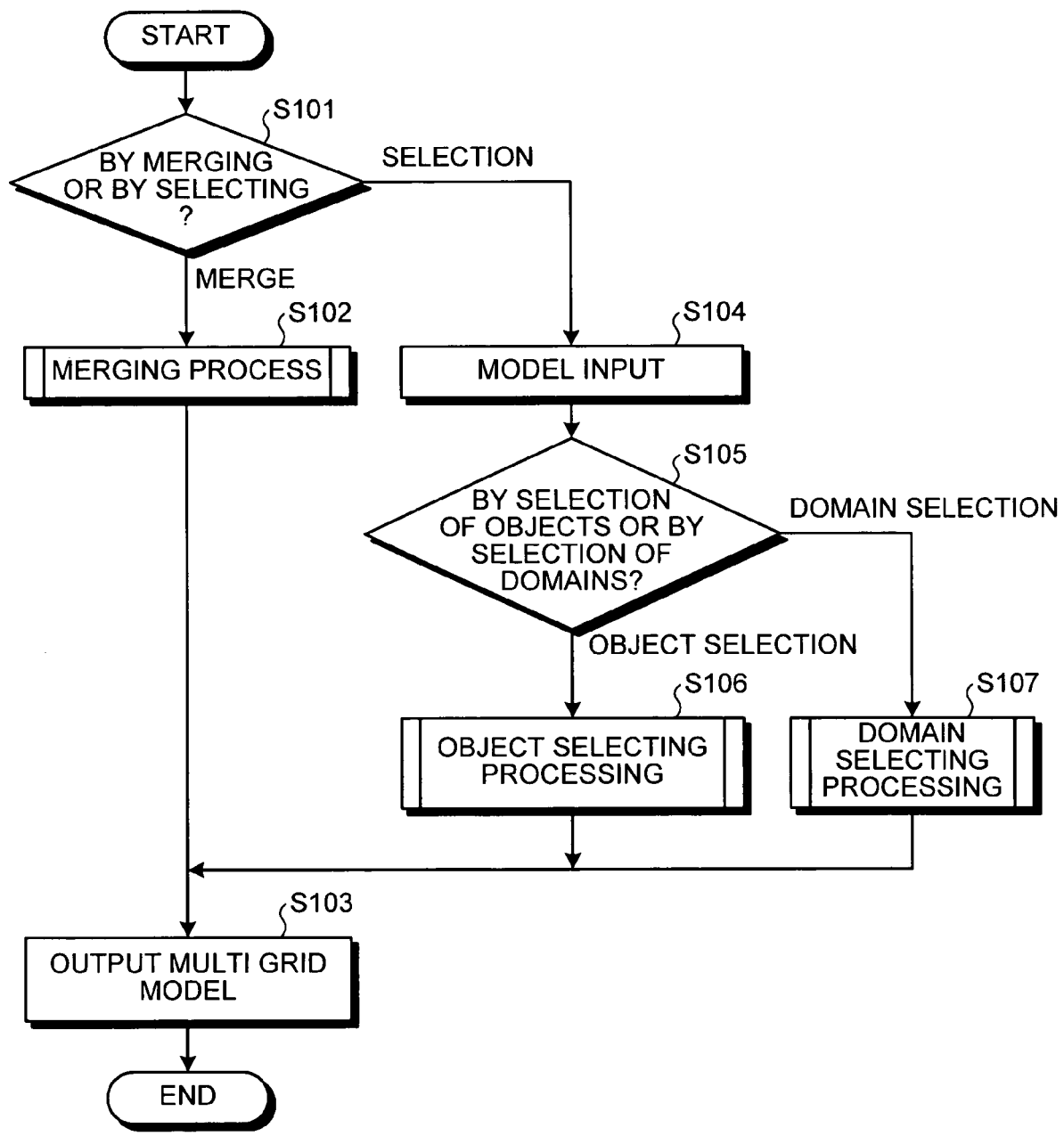
FIG. 14 is a flowchart of a process by a multi grid model creating unit.

Next, processing procedures of the multi grid model creating unit 100 are explained hereinafter. FIG. 14 is a flow chart of the processing procedures of the multi grid model creating unit 100. As shown in the figure, this multi grid model creating unit 100 makes a user designate whether to create a multi grid model by merging partial models or to create a multi grid model by selecting objects or domains from an entire model (step S101).

Then, when merging is designated, the merging unit 101 creates a multi grid model through its merging process and stores the information thereof into the model memorizing unit 104 (step S102), and the multi grid model output unit 109 outputs the multi grid model to the multi grid model file 22 by use of the information of the model memorizing unit 104 (step S103).

On the other hand, the selection is designated, the multi grid model creating unit inputs the entire model from the single grid model file 21 and stores it into the model memorizing unit 104 (step S104). By inputting the multi grid model file 22 in the place of the single grid model file 21 and storing it to the model memorizing unit 104, previously created multi grid models may be modified.

Then, the multi grid model creating unit makes a user designate whether to create a multi grid model by selection of objects, or to create a multi grid model by selection of domains (step S105), and when the object selection is designated by the user, the object selecting unit 102 creates a multi grid model by its object selecting processing and stores the information thereof into the model memorizing unit 104 (step S106), and the multi grid model output unit 109 outputs the multi grid model to the multi grid model file 22 by use of the information of the model memorizing unit 104 (step S103).

On the other hand, when the domain selection is designated by the user, the domain selecting unit 103 creates a multi grid model by its domain selecting processing and stores the information thereof into the model memorizing unit 104 (step S107), and the multi grid model output unit 109 outputs the multi grid model to the multi grid model file 22 by use of the information of the model memorizing unit 104 (step S103).

In this manner, the merging unit 101, the object selecting unit 102 or the domain selecting unit 103 creates a multi grid model and stores it into the model memorizing unit 104, and the multi grid model output unit 109 outputs the multi grid model to the multi grid model file 22 by use of the information of the model memorizing unit 104, thereby it is possible to easily create the multi grid model.

Figure 15:
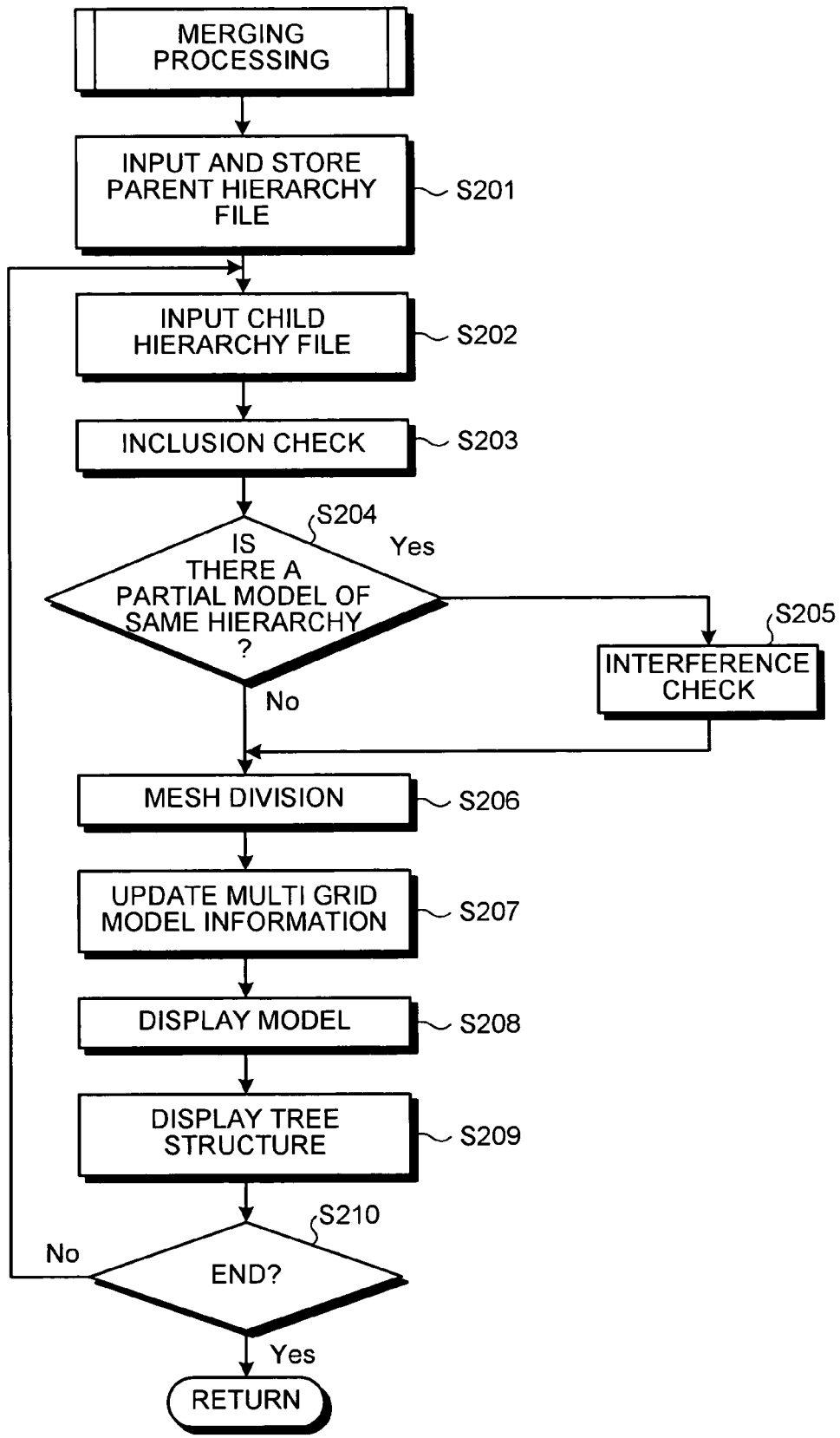
FIG. 15 is a flowchart of a merging processing by a merging unit.

Next, processing procedures of a merging processing by the merging unit 101 (step S102) is explained hereinafter. FIG. 15 is a flow chart of the processing procedures of a merging processing by the merging unit 101. As shown in the figure, this merging unit 101 first inputs the parent hierarchy file 22a designated by the user, and stores it into the model memorizing unit 104 (step S201).

Then, the merging unit inputs the child hierarchy file 22b designated by the user (step S202), and an inclusion check by the inclusion checking unit 107 is carried out between the partial models of the input child hierarchy file 22b and the model of its parent hierarchy (step S203).

Then, the merging unit judges whether there is a partial model of the same hierarchy in the model memorizing unit 104 (step S204), and when there is a partial model of the same hierarchy, an interference check by the interference checking unit 106 is carried out (step S205).

Thereafter, mesh division by the mesh dividing unit 108 is carried out (step S206), and the information of the multi grid model stored in the model memorizing unit 104 is updated (step S207). Further, the merging unit displays a multi grid model to which the child hierarchy file 22b has been added and a file tree structure via the model displaying unit 105 (step S208 and step S209).

Then, the merging unit judges whether the user ends the merging operation (step S210), and when the user does not end it, the procedures go back to the step S202 where the process to merge other child hierarchy file 22*b* is repeated, meanwhile, when the user ends the operation, the merging processing is completed.

In this manner, this merging unit 101 inputs the child hierarchy file 22*b* and merges it into the entire model, thereby it is possible to create a multi grid model from the signal grid model file 21.

This merging unit 101 may read the multi grid model file 22, and create a multi grid model from the parent hierarchy file 22*a* and the child hierarchy file 22*b* based on the information of the control file 22*c* and store it into the model memorizing unit 104, and carry out the processes from the step S202.

Figure 16:
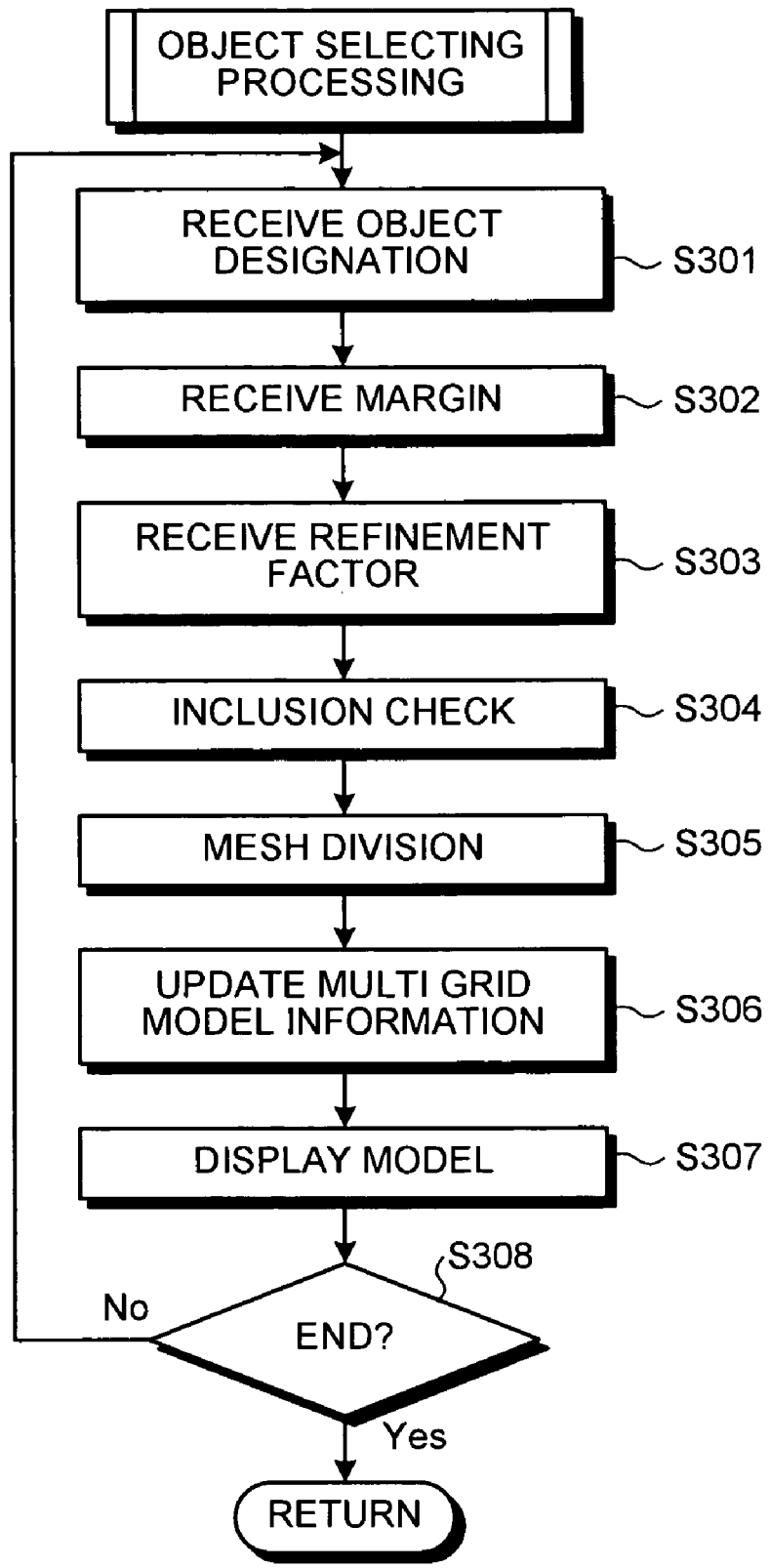
FIG. 16 is a flowchart of an object selecting processing by an object selecting unit.

Next, processing procedures of an object selecting processing by the object selecting unit 102 (step S106) are explained hereinafter. FIG. 16 is a flow chart of the processing procedures of an object selecting processing by the object selecting unit 102.

As shown in the figure, this object selecting unit 102 receives an object designation, a margin of the sub grid domain including the object, and a refinement factor from the user (step S301 to step S303).

Then, the object selecting unit carries out an inclusion check of the sub grid domain (step S304), and carries out a mesh division by use of the refinement factor (step S305). Then, based on the result of the mesh division, it updates the information of the multi grid model of the model memorizing unit 104 (step S306), and displays the updated multi grid model (step S307).

Then, the object selecting unit judges whether the user ends the object selection (step S308), and when the user does not end, it goes back to the step S301 where it repeats creating sub grid domains by other object designation, meanwhile, when the user ends, it completes the object selecting processing.

In this manner, the object selecting unit 102 divides grids of the sub grid domain including objects, thereby, it is possible to create a multi grid model from a single grid model.

Figure 17:
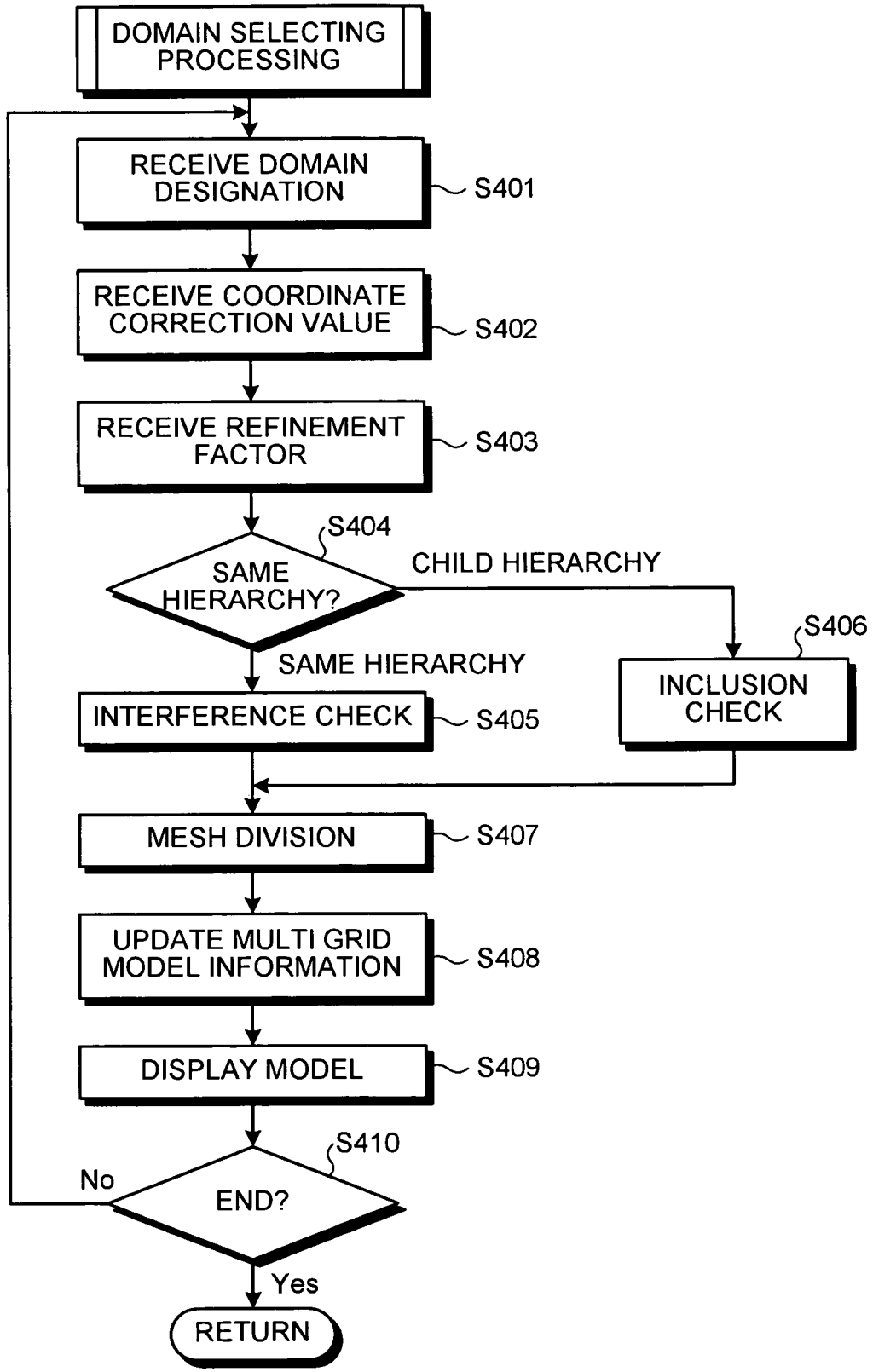
FIG. 17 is a flowchart of a domain selecting processing by a domain selecting unit.

Next, processing procedures of a domain selecting processing by the domain selecting unit 103 (step S107) are explained hereinafter. FIG. 17 is a flow chart of the processing procedures of a domain selecting processing by the domain selecting unit 103.

As shown in the figure, this domain selecting unit 103 receives a domain designation via the mouse, a coordinate correction value of the domain, and a refinement factor from the user (step S401 to step S403).

Then, the domain selecting unit judges whether the hierarchy of the designated domain is same as the current hierarchy (step S404), and when it is the same hierarchy, the domain selecting unit carries out an interference check (step S405), meanwhile, when it is a child hierarchy, the domain selecting unit carries out an inclusion check (step S406).

Then, the domain selecting unit carries out a mesh division by use of the refinement factor (step S407), and updates the multi grid model information of the model memorizing unit 104 based on the result of the mesh division (step S408), and displays the updated multi grid model (step S409).

Then, the domain selecting unit judges whether the user end the domain selection (step S410), and when the user does not end, the domain selecting unit goes back to the step S401 where it repeats creating sub grid domains by other domain designation, meanwhile, when the user ends, the domain selecting unit completes the domain selecting processing.

In this manner, the domain selecting unit 103 divides grids with the domain designated by the user as a sub grid domain, thereby it is possible to create a multi grid model from a single grid model.

As explained heretofore, in the present embodiment, the merging unit 101 merges partial models into an entire model, and divides a grid of a parent hierarchy into grids of a child hierarchy based on hierarchical relations among partial models, and the object selecting unit 102 divides grids with the object inclusion domain including objects selected from the entire model by the user as a sub grid domain, and the domain selecting unit 103 divides grids with the domain selected from the entire model by the user as a sub grid domain, thereby it is possible to easily create a multi grid model.

In the present embodiment, an apparatus for analyzing an electromagnetic wave has been explained heretofore, meanwhile, by realizing a structure that this apparatus for analyzing an electromagnetic wave has by software, an electromagnetic wave analysis program having the same functions may be obtained. Therefore, a computer that executes this electromagnetic wave analysis program is explained hereinafter.

Figure 18:
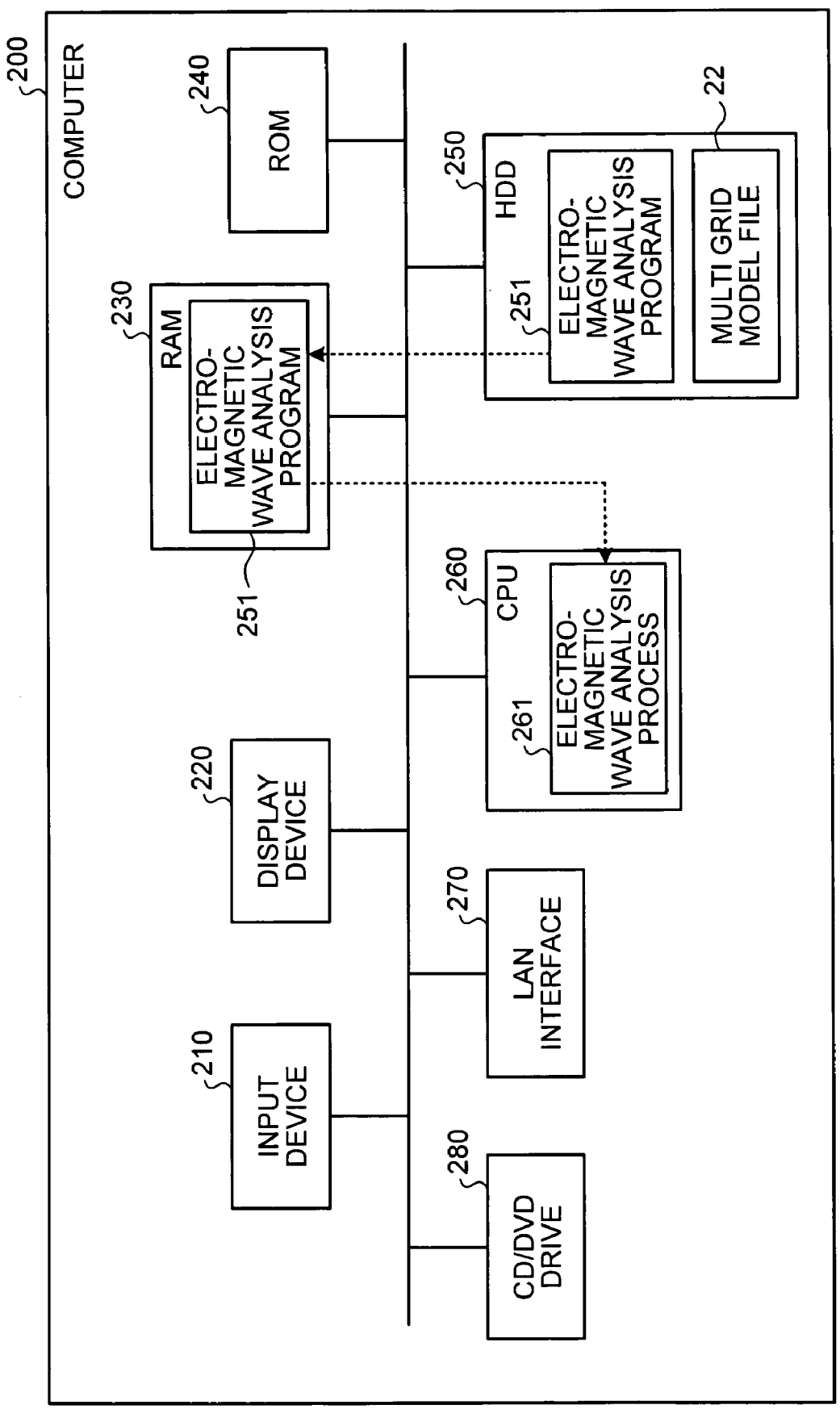
FIG. 18 is a block diagram of a computer that executes a computer program for analyzing an electromagnetic wave according to an embodiment of the present embodiment.

FIG. 18 is a functional block diagram of a structure of a computer that executes an electromagnetic wave analysis program according to the present embodiment. As shown in the figure, this computer 200 includes an input device 210, a display device 220, a random-access memory (RAM) 230, a read-only memory (ROM) 240, a hard disk drive (HDD) 250, a central processing unit (CPU) 260, a local area network (LAN) interface 270, and a compact disk (CD)/digital versatile disk (DVD) drive 280.

The input device 210 is a mouse and a keyboard that a user uses to input instructions and data to the computer 200, and the display device 220 is a liquid crystal display that displays the output result of the computer 200.

The RAM 230 is a memory that memorizes an electromagnetic wave analysis program 251 read from the HDD 250 and execution halfway results of the electromagnetic wave analysis program 251, and the ROM 240 is a read only memory that memorizes constants and so forth.

The HDD 250 is a memory device that memorizes the electromagnetic wave analysis program 251 to be executed by the CPU 260 and a multi grid model file 22 and so forth, meanwhile, the CPU 260 is a processor that reads the electromagnetic wave analysis program 251 from the HDD 250 to the RAM 230 and executes the program.

The LAN interface 270 is an interface that connects the computer 200 to a LAN, and the CD/DVD drive 280 is a device that reads and writes a CD and a DVD.

Further, the electromagnetic wave analysis program 251 installed in the HDD 250 is read by the CPU 260 to the RAM 230, and is executed as an electromagnetic wave analysis process 261 by the CPU 260.

The electromagnetic wave analysis program 251 is read from a CD/DVD by the CD/DVD drive 280 and installed into the HDD 250. Alternatively, this computer 200 may receive the electromagnetic wave analysis program 251 via a LAN from other computer, and install the program into the HDD 250.

According to the present invention, it is possible to improve the efficiency of an electromagnetic wave analysis.

Furthermore, according to the present invention, it is possible to easily create a multi grid model.

Moreover, according to the present invention, it is possible to easily carry out an electromagnetic wave analysis by a multi grid model.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for analyzing electromagnetic waves generated by an electronic device, comprising:
a controlling unit that receives a designation whether to create a multi grid model by merging a plurality of partial models or to create the multi grid model by selecting an object or a domain from an entire model;
a multi grid model creating unit that creates, when merging the plurality of partial models is designated, the multi grid model from the plurality of partial models; and
an analyzing unit that analyzes the electromagnetic waves using the multi grid model, wherein
the multi grid model has a construction in which each of the plurality of partial models is hierarchically merged, and
the multi grid model creating unit checks interference among the plurality of partial models that belong to a same hierarchy, and checks for the partial models that belong to hierarchies having a parent-child relationship by checking whether the partial model of the child hierarchy is completely included in the partial model of the parent hierarchy.

2. The apparatus according to claim 1, wherein
the multi grid model creating unit includes a display unit, and
the display unit displays a hierarchical relationship between the partial models used to create the multi grid model in a tree structure.

3. The apparatus according to claim 1, wherein
the multi grid model creating unit includes a display unit, and
the display unit displays the multi grid model created.

4. The apparatus according to claim 1, wherein the multi grid model creating unit creates a projected image to which all the objects are projected onto a boundary plane of an entire domain of a model, and creates the multi grid model by performing mesh division in an order from a parent hierarchy to a child hierarchy using the projected created.

5. A method for analyzing electromagnetic waves generated by an electronic device, comprising:
receiving a designation whether to create a multi grid model by merging a plurality of partial models or to create the multi grid model by selecting an object or a domain from an entire model;
creating, when merging the plurality of partial models is designated, a multi grid model from the plurality of partial models; and
analyzing the electromagnetic waves using the multi grid model, wherein
the multi grid model has a construction in which each of the plurality of partial models is hierarchically merged, and
the creating includes checking interference among the plurality of partial models that belong to a same hierarchy, and checks for the partial models that belong to hierarchies having a parent-child relationship by checking whether the partial model of the child hierarchy is completely included in the partial model of the parent hierarchy.

6. A computer-readable recording medium that stores a computer program for analyzing electromagnetic waves generated by an electronic device, the computer program making a computer execute:
receiving a designation whether to create a multi grid model by merging a plurality of partial models or to create the multi grid model by selecting an object or a domain from an entire model;
creating, when merging the plurality of partial models is designated, a multi grid model from the plurality of partial models; and
analyzing the electromagnetic waves using the multi grid model, wherein
the multi grid model has a construction in which each of the plurality of partial models is hierarchically merged, and
the creating includes checking interference among the plurality of partial models that belong to a same hierarchy, and checks for the partial models that belong to hierarchies having a parent-child relationship by checking whether the partial model of the child hierarchy is completely included in the partial model of the parent hierarchy.

* * * * *